United States Patent
Heid

(10) Patent No.: US 8,229,542 B2
(45) Date of Patent: Jul. 24, 2012

(54) METHOD FOR CORRECTION OF IMAGE ARTIFACTS DURING ACQUISITION OF MAGNETIC RESONANCE IMAGING DATA

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 1239 days.

(21) Appl. No.: 11/673,258

(22) Filed: Feb. 9, 2007

(65) Prior Publication Data

US 2007/0229071 A1 Oct. 4, 2007

(30) Foreign Application Priority Data

Feb. 10, 2006 (DE) .................. 10 2006 006 274

(51) Int. Cl.
*A61B 5/05* (2006.01)
(52) U.S. Cl. ........ 600/410; 600/419; 324/307; 324/309; 324/313
(58) Field of Classification Search .................. 600/410, 600/419; 324/307, 309, 313
See application file for complete search history.

(56) References Cited

U.S. PATENT DOCUMENTS

| | | | |
|---|---|---|---|
| 5,877,629 A * | 3/1999 | King et al. | 324/309 |
| 5,923,168 A * | 7/1999 | Zhou et al. | 324/309 |
| 6,064,205 A | 5/2000 | Zhou et al. | |
| 6,229,309 B1 | 5/2001 | Aldefeld | |
| 6,369,568 B1 * | 4/2002 | Ma et al. | 324/309 |
| 6,515,478 B1 | 2/2003 | Wicklow et al. | |
| 6,545,476 B1 | 4/2003 | Heid | |

OTHER PUBLICATIONS

"Handbook of MRI Pulse Sequences," Bernstein et al, Chapter 10 "Correction Gradients" (2004) pp. 292-299.

* cited by examiner

*Primary Examiner* — Brian Casler
*Assistant Examiner* — Joseph Santos
(74) *Attorney, Agent, or Firm* — Schiff Hardin LLP

(57) ABSTRACT

A method for correcting image artifacts during the acquisition of magnetic resonance imaging data includes the following steps. At least one part of the linear, location-dependent and spatially constant interference fields arising at the measurement location is determined in a time interval between an excitation point in time and a MR data acquisition point in time.

7 Claims, 2 Drawing Sheets

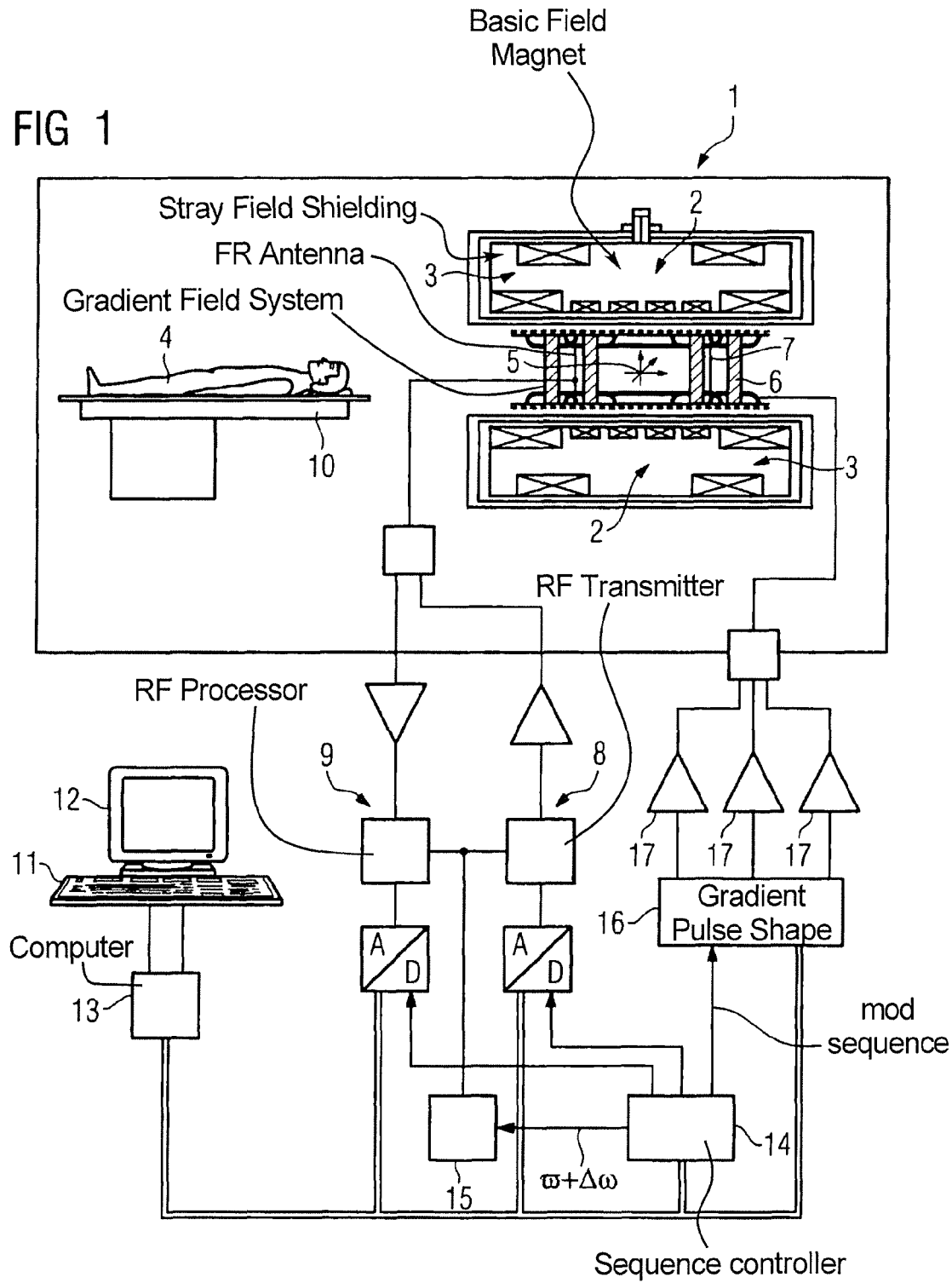

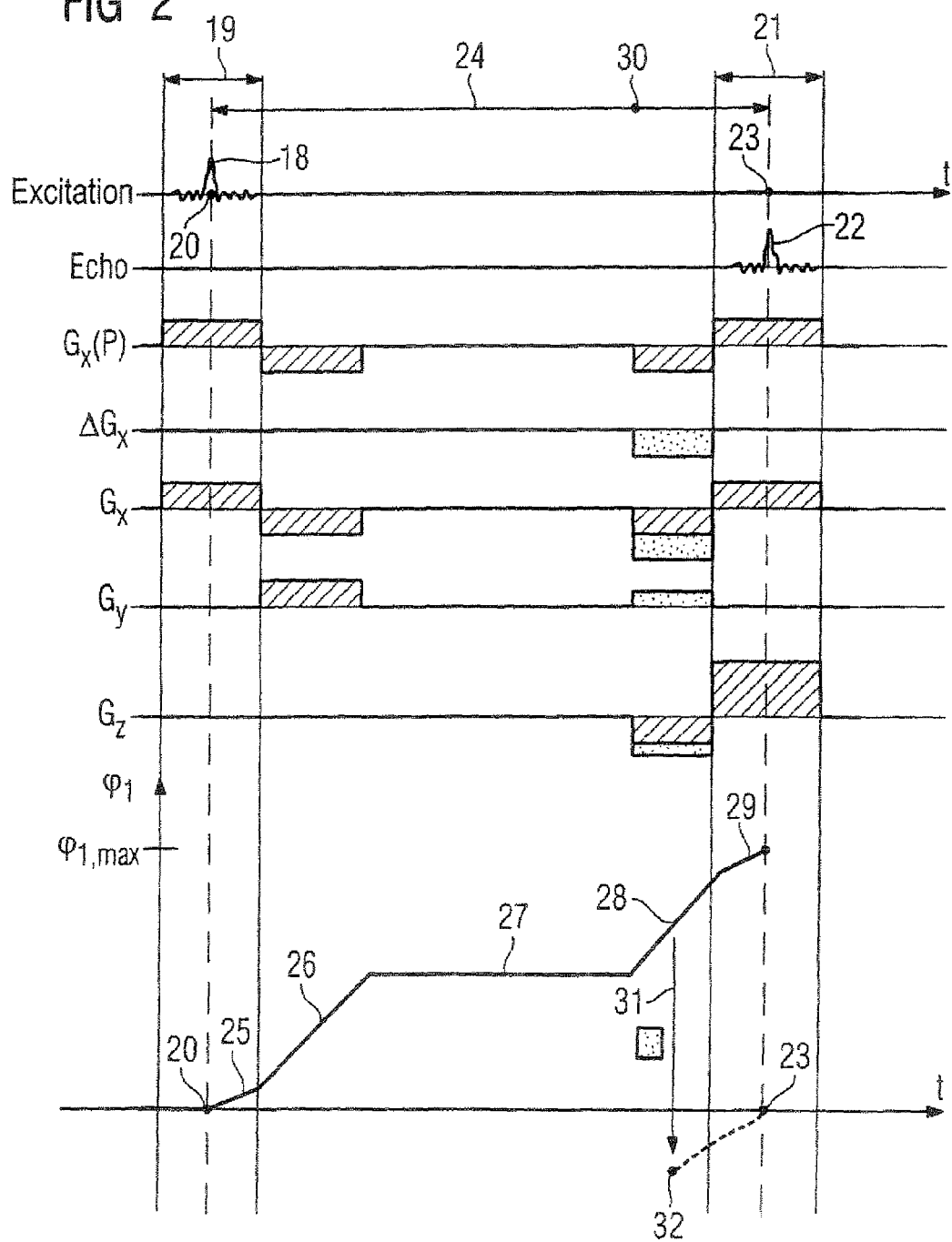

METHOD FOR CORRECTION OF IMAGE ARTIFACTS DURING ACQUISITION OF MAGNETIC RESONANCE IMAGING DATA

BACKGROUND OF THE INVENTION

1. Field of the Invention

The invention concerns a method for avoidance of image artifacts in a magnetic resonance system operating with pulse sequences, the magnetic resonance system having gradient coils for generation of fields gradient and a radio-frequency transmitter for emission of an RF excitation signal. The artifacts are being caused by interference fields directed transversely to the gradient fields.

2. Description of the Prior Art

Maxwell's equations establish that interference fields that are transverse to a magnetic gradient field inevitably occur upon the generation of the gradient field. The interference fields can be directly derived from Maxwell's equations and are often also designated as Maxwell terms. Given generation of an x-gradient in a magnetic resonance apparatus, a transverse z-gradient thus always also arises in the x-component of the magnetic field. These interference fields frequently generate image distortions and image artifacts.

A number of methods have been proposed for suppression of the effects of Maxwell term. For example, the additional phase arising in the image due to the interference fields can be mathematically removed, but this is not applicable when the spin phase itself represents a relevant measurement value, in particular given interferences of k-space trajectories. Examples of phase-sensitive sequences are the turbo spin echo (TSE) sequences and the SPI sequences ("echo planar imaging").

DE 199 31 210 A1 discloses a further method, wherein it is proposed to compensate the phase position displacement that is caused by transversal magnetic interference fields by frequency shifting the excitation frequency and/or by using a gradient offset at the corresponding gradient coil. A continuous correction is proposed in order to keep the phase position displacement at zero. However, a specific, fixed measurement position is assumed, so that the method has proven unsuitable for multi-slice measurements, since ultimately suitable average values for the respective offset must be encountered that allow no optimal correction. A high current consumption is additionally generated due to the permanently-present gradient offset and the maximum performance of the gradient coils is reduced.

SUMMARY OF THE INVENTION

An object of the present invention is to provide a method of the above type that allows an individual, slice-related correction as well as a more effective usage of the gradient coils.

This object is achieved in accordance with the present invention in a method of the aforementioned type and includes the following steps.

At least one part of the linear, location-dependent and spatially constant interference fields arising at the measurement location is determined in a time interval between an excitation point in time and a MR data acquisition point in time.

From the time curve of the linear location-dependent or spatially-constant interference fields, a first or second phase position displacement that occur during the time interval due to the interference fields is determined.

A single correction field pulse is determined per gradient coil, the correction field pulse generating a phase correction essentially corresponding to the negative of the first phase position displacement.

A constant phase and/or frequency shift is determined for phase correction of the second phase position displacement.

The correction field pulse is radiated by the gradient coils at a specific point in time within the time interval.

The phase or frequency shift is embodied in the radio-frequency pulse pr pulses transmitted during both an excitation phase and a measurement phase.

The inventive method is based on the insight that the interference fields are lowest in proximity to the coordinate origin and all but disappear at the coordinate origin. A point in the slice to be measured (for example the slice middle point) can be mathematically transformed into the origin of the coordinate system by a coordinate transformation. However, since this point generally does not correspond to the origin of the coordinate system of the magnetic resonance system (iso-center) on the basis of which the gradient fields are generated, interference field terms that can be derived from Maxwell's equations arise due to the transformation of the magnetic field at the new coordinate origin. These interference field terms must be compensated to avoid the artifacts, and the significant interference field contribution are supplied by the terms that are constant with regard to the location dependency or are linearly location-dependent, and thus exhibit the same order as the basic magnetic field and the gradient fields.

The pulse sequences (i.e., the activation of the radio-frequency transmitter and the gradient coils) follow a precise chronological sequence. The resulting field effects that occur in the course of the measurement cycle thus are known, such that the interference fields at the location of the measurement (also a number of locations given multi-slice measurements) can easily be determined in a time-dependent manner for this time span. The interference fields also displace the phase of the excited spin; a phase position displacement thus occurs. This is determined from the temporal integral of the interference field contributions over the entire time duration before the measurement point in time and comprises two contributions, the first phase position displacement and the second phase position displacement. Only an adaptation of the sequence or phase of the radio-frequency transmitter that is to be applied during the relevant activity (transmission, acquisition) is required for correction of the second phase position displacement that results from spatially constant interference field terms. However, since the gradient coils can generate linearly location-dependent fields, using these fields it is only possible to compensate the first phase position displacement caused by linear location-dependent interference field terms. The present invention thus departs from the conventional approach in the prior art, where the compensation ensues point-by-point, thus continuously. The inventive method is effectively a type of "bookkeeping" over the occurring phase position displacement, such that this can be compensated all at once by one or more correction field pulses at any point in time before the measurement phase. Since the phase position displacement generated in the framework of the pulse sequence is always positive, this essentially means that, at a specific point in time, the phase is turned back (meaning brought down) by the correction field pulses by a value that corresponds to the total amount of the first phase position displacement arising in the time interval. In other words, the phase is overcompensated at a point in time in the interval such that ultimately the deviation of the phase due to the total first phase position displacement is compensated using the first phase position displacement that will later occur. The second phase position displacement is corrected by the application of the phase and/or sequence shift at the radio-frequency pulse or pulses transmitted during both the excitation phase and the measurement phase.

It is thus no longer necessary to have a constant gradient offset and, moreover, the correction method is advantageously more exact since the compensation is matched (adapted) to the corresponding measurement location or the corresponding measurement point in time.

The correction field pulse can be superimposed on a pulse sequence of the gradient coil with particular advantage, meaning that the pulse sequence of the gradient coils must merely be adapted. This can occur, for example, by the amplitude of a gradient pulse of the pulse sequence being reduced or increased. In a preferred embodiment, the method for automatic modification of a pulse sequence including phase or frequency shift is carried out by an operating personnel after programming a pulse sequence. As soon as all data about the measurement are available to a magnetic resonance system, the shift at the radio-frequency transmitter and the correction field pulse or pulses at the gradient coils are determined and the pulse sequence is correspondingly modified without further assistance by the operating personnel. The magnetic resonance system is then controlled with the modified pulse sequence such that artifacts due to the interference fields are prevented.

The method is particularly advantageously suitable for use in multi-slice measurements. The method steps can be implemented for each slice in a multi-slice measurement. This means that the location and point in time of the measurement are determined for each slice and the phase position displacement at the measurement point in time is also calculated for each slice. It should be noted that the influence of the compensation measures for another slice should also be considered. For example, there are pulse sequences in which a first slice is initially excited, then a second slice is excited, the first slice is measured and after this the second slice is measured. In such a case the correction field pulse or pulses and the phase or frequency shift also have an influence on the second slice, such that a further phase position displacement is generated in the second slice. This phase position displacement can also be determined in both of its portions and be taken into account at the second measurement point in time for the determination of the correction pulse and the phase or frequency shift with regard to the second slice. Thus further magnetic fields incurred during the temporary image acquisition cycle, in particular the magnetic fields arising due to correction pulses and phase or frequency shifts with regard to other slices, are determined for each slice up to the measurement point in time and from these the constant phase or frequency shift and the correction field pulse are determined. The slices are processed in the order of their measurement points in time, such that all prior correction fields are also considered in later measurements. Due to the "phase position displacement accounting" of the present invention, an average thus no longer has to be used for compensation of the phase position displacement; rather, each slice can be individually corrected with regard to phase. In accordance with the invention it is also possible to consider even the effects of preceding measurement cycles on the respective slice.

The determination of the interference fields can ensue mathematically using a displacement (shift) of the origin of the coordinate system to the slice middle position. In order to determine the relevant terms, namely the spatially-constant interference fields and the spatially linearly-dependent interference fields, a Taylor expansion can be used up to the corresponding order.

The determined point in time, for example, can be immediately before the beginning of the measurement phase.

DESCRIPTION OF THE DRAWINGS

FIG. 1 schematically illustrates an embodiment of a magnetic resonance system in which the inventive method can be applied.

FIG. 2 shows an example of a measurement sequence in accordance with the inventive method.

DESCRIPTION OF THE PREFERRED EMBODIMENTS

For a more detailed understanding of the present invention, a short explanation of the physical backgrounds initially follows. The method is concerned with the avoidance of image artifacts which arise due to interference fields transversal to the gradient fields, which interference fields are generated with these gradient fields. The effect that, with generation of a gradient field in one direction, a gradient field in a direction perpendicular to this is also generated is a direct result of Maxwell's equations for magnetic fields. In the absence of moving charges, it thus applies that $$\mathrm{curl}\vec{B} = 0 \Rightarrow \frac{\delta B_z}{\delta x} - \frac{\delta B_x}{\delta z} = 0, \qquad (1)$$

wherein $B_x$ is the x-component and $B_z$ is the z-component of the magnetic field in a magnetic resonance system. Given generation of a $B_z$-gradient in the x-direction, a $B_x$-gradient will consequently always also arises in the x-direction. Since the creation of the transversal interference fields is thus based on a fundamental physical fact, these interference fields cannot be avoided. The magnitude of the magnetic field $|\vec{B}|=B$ (from whose integral over the time the phase of excited spins results) is determined from the root of the squares of the respective direction portions $B_x$, $B_y$, $B_z$. A Taylor expansion of these magnetic field strengths yields $$\begin{aligned} B &= B_0 + \vec{x} \cdot \vec{G} + \vec{x}^T \cdot H \cdot \vec{x} + O(|\vec{x}|^3) \\ &= B_0 + xG_x + yG_y + zG_z + x^2 H_{xx} + y^2 H_{yy} + z^2 H_{zz} + \\ &\quad xzH_{xz} + yzH_{yz} + \ldots \end{aligned} \qquad (2)$$

In this equation the terms of the second order are described in spatial coordinates by the matrix H; these are the cause for the transversal interference fields already mentioned. Its curve is parabolic, which this means that the interference fields close to the coordinate origin are very small, but grow very quickly and more strongly than the actual gradient fields (the terms of the first order) with increasing distance.

If a locations remote from the coordinate origin is now considered, which location is described by the coordinates $x_0$, $y_0$, $z_0$, the origin of the coordinate system can be mathematically shifted to this position such that the terms of the second order are negligibly small at the remote location. However, further constant and linearly location-dependent terms that describe the interference fields arise due to this shift. This is now explained in detail for the example of cylindrical gradient coils, for which the entries of the matrix H are $$H_{xx} = \frac{G_z^2}{8B_0} \qquad H_{yx} = 0 \qquad H_{zx} = 0 \qquad (3)$$

$$H_{xy} = 0 \qquad H_{yy} = \frac{G_z^2}{8B_0} \qquad H_{zy} = 0$$

$$H_{xz} = -\frac{G_x G_z}{2B_0} \qquad H_{yz} = -\frac{G_y G_z}{2B_0} \qquad H_{zz} = \frac{G_x^2 + G_y^2}{2B_0}$$

If the difference of the Taylor expansions at the origin (which in most cases corresponds to the isocenter of the magnet) and the location of the measurement $x_0$, $y_0$, $z_0$ is now determined, $$\Delta B = \begin{cases} -x_0 G_x - y_0 G_y - z_0 G_z + x_0^2 H_{xx} + y_0^2 H_{yy} + \\ z_0^2 H_{zz} + x_0 z_0 H_{xz} + y_0 z_0 H_{yz} \\ -x(2x_0 H_{xx} + z_0 H_{xz}) \\ -y(2y_0 H_{yy} + z_0 H_{yz}) \\ -z(2z_0 H_{zz} + x_0 H_{xz} + y_0 H_{yz}) \\ + \ldots \end{cases} \qquad (4)$$

results for the magnitude of the interference fields, whereby (as mentioned) here only the terms up to the first order should be considered. A constant term $$\Delta B_0 = x_0 G_x - y_0 G_y - z_0 G_z + x_0^2 H_{xx} + y_0^2 H_{yy} + z_0^2 H_{zz} + x_0 z_0 H_{xz} + y_0 z_0 H_{yz} \qquad (5)$$

is thus obtained and a linear, gradient field-like term is respectively obtained for each spatial direction, summarized as $$\Delta G = -x(2x_0 H_{xx} + z_0 H_{xz}) - y(2y_0 H_{yy} + z_0 H_{yz}) - z(2z_0 H_{zz} + x_0 H_{xz} + y_0 H_{yz}) \qquad (6)$$

These terms reflect the interference fields whose effects should be compensated via the method. The phase position displacements can now be determined from the magnitudes of the interference fields, namely a first phase position displacement (with regard to the linearly location-dependent terms) and a second phase position displacement (with regard to the spatially constant terms). The phase position displacement that is a temporal integral over the magnitude of the magnetic field results from $$\phi_1 = \int \Delta G \, dt \qquad (7)$$

and $$\phi_2 = \int \Delta B_0 \, dt \qquad (8)$$

FIG. 1 shows the basic design and the interaction of the components in a magnetic resonance system 1 that is fashioned for implementation of the inventive method. A basic field magnet 2 that is fashioned as an axial superconducting air-core coil magnet with an active stray field shielding 3 generates a temporally constant and homogeneous magnetic field $B_0$ for polarization of the atomic nuclei in an examination subject, here the patient 4. The basic magnetic field $B_0$ is axially aligned with regard to the magnet and defines the z-coordinate direction of a rectangular coordinate system 5.

A cylindrical gradient coil system 6 is inserted into the magnet bore. The gradient coil system 6 has three gradient coils that each generate a gradient field proportional to the respective applied current, and being respectively spatially perpendicular relative to one another. The gradient fields respectively serve different purposes (slice selection, coding, readout). A radio-frequency antenna 7 is located within the gradient coil system 6. It has the task of converting the radio-frequency pulses emitted by an radio-frequency transmitter 8 during the excitation phase into an alternating magnetic field for excitation of the atomic nuclei and subsequently of acquiring an alternating field emanating from the precessing atomic moment during the measurement phase and supplying this alternating field to an RF processor 9. The patient bed is designated with 10. The control and operation of the magnetic resonance system 1 ensues via a keyboard 11 and a monitor 12 that are connected with a computer 13. Specific operating commands (such as the starting of the acquisition) can be input there and pulse sequences can be established. These commands are passed to the pulse sequence controller 14. The pulse sequence controller 14 is designed to modify the pulse sequence with regard to a compensation of the phase position displacement. Among other things, the radio-frequency generator 15 for the radio-frequency transmitter 7 and the gradient pulse shape generator 16 are controlled by the pulse sequence controller 14. The gradient coils 6 can be controlled by the gradient pulse shape generator 16 by gradient amplifiers 17.

The inventive method is executed according as follows in the magnetic resonance system 1. A pulse sequence is initially programmed or selected by the control elements 11 and 12 of the computer 13. This pulse sequence is supplied to the pulse sequence controller 14. The pulse sequence controller 14 thus knows precisely at which point in time which gradients are present; this means that the field magnitudes of the formulas (5) and (6) and their temporal dependency are known. From this the pulse sequence controller determines the first and the second phase position displacement $\phi_1$ and $\phi_2$ according to (7) and (8). A frequency shift $\Delta\omega$ is determined for compensation of the second phase position displacement $\phi_2$ generated by the spatially constant interference field portion. The radio-frequency generator 15 is activated with a frequency value shifted by $\Delta\omega$ during the excitation phase and the measurement phase. The second phase position displacement is hereby compensated. For compensation of the first phase position displacement $\phi_1$ the pulse sequence controller 14 maximally determines a single correction field pulse for each gradient coil. In particular cases it can also naturally be possible that only a single correction field pulse is required for only a single gradient coil. This additional pulse or the additional pulses are then respectively superimposed on the corresponding pulse sequence for the gradient coil 6 and the modified pulse sequence is forwarded to the gradient pulse shape generator 16 which correspondingly activates the gradient coils.

The modification of the pulse sequence for the gradient coils is shown in detail in FIG. 2 together with the effect on the phase position displacement. The time axis t runs to the right. The uppermost graph shows the excitation pulse 18 that is emitted by the radio-frequency antenna during the excitation phase 19. It achieves its maximum amplitude at the excitation point in time 20. The measurement signal 22 is measured in a measurement phase 21. The measurement point in time 23 lies within the measurement phase 21. In the framework of the pulse sequence, various gradient pulses $G_x$, $G_y$, $G_z$ are supplied to the gradient coils during the time interval 24 between excitation point in time 20 and measurement point in time 23. The gradient pulses specified by the programmer of the pulse sequence are shown hatched in FIG. 2. They generate the interference fields that cause a phase position displacement. The arising first phase position displacement $\phi_1$ due to the linear spatially-dependent interference fields is shown in its time curve all the way at the bottom in FIG. 2. Initially no phase position displacement exists at the excitation point in time 20. A phase position displacement already occurs within the measurement phase 19 due to the active slice selection gradient $G_x$ (see section 25). After this the phase coding gradient $G_y$ is also active such that the phase position displacement increasingly grows (section 26). At times in which no gradient coil is actively switched (as in section 27), the phase position displacement also does not grow. A strong rise occurs again in section 28 since the readout gradient $G_z$ is already also active in addition to the slice-selection gradient $G_x$. Both also remain active in the measurement phase 21, such that the phase position displacement $\phi_1$ increases again in section 29 and assumes a specific value $\phi_{1,max}$ at the measurement point in time 23. It is thereby to be noted that the phase position displacement can only increase since the diagonal elements of the matrix H are greater than 0.

The pulse sequence controller now determines one correction field pulse per gradient coil, which correction field pulse generates a phase correction precisely corresponding to the negative of the first phase position displacement $\phi_{1,max}$. These correction field pulses are shown dotted in FIG. 2. They are superimposed on the programmed pulse sequence (shown hatched). This is explained in detail in the example of the slice-selection gradient $G_x$. The graph $G_x(P)$ shows the activity of the x-gradient coil as it is programmed in the pulse sequence. The pulse sequence controller now has determined the correction field pulse shown in the graph with regard to $\Delta G_x$. This is superimposed on the programmed sequence $G_x(P)$ at a specific point in time 30 within the time interval 24, such that a modified sequence results as an ultimate sequence series $G_x$ as shown. Since no pulse was provided for the phase coding gradients $G_y$ at the determined point in time 30, here the correction field pulse is simply added. A correction field pulse that is superimposed on a programmed pulse is also provided for the readout gradient $G_z$. Ultimately, as schematically shown by the arrow 31, the phase $\phi_1$ is thus decreased by the amount $\phi_{1,max}$ at the point in time 30. It is thereby negatively overcompensated, as can be seen at point 32. This overcompensation is necessary so that a compensation is achieved due to the pulses still to follow at the measurement point in time 23.

This modification of the pulse sequence naturally ensues in addition to the modification of the frequency and/or phase in the excitation phase 19 and of the measurement phase 21 by the specific phase a frequency shift.

Although the method is described herein for a measurement of a slice, it can be advantageously to be applied in multi-slice measurements, but it should be noted that the phase compensation measures that were effected for earlier measurements on other slices possibly also have an influence on the subsequent slices. Since it is generated by the pulse sequence controller itself, however, this influence is also precisely known and is taken into account for determination of the correction field pulses or, respectively, the phase or frequency shift. In other words, this means that the phase position displacement also ensues for each location (meaning each slice) under consideration of the previous correction field pulses and phase and frequency shifts already determined and implemented for other slices.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting image artifacts in a magnetic resonance system, comprising the steps of:

selecting a pulse sequence for operating a magnetic resonance data acquisition unit to acquire magnetic resonance data from an examination subject located at least partially within the magnetic resonance data acquisition unit;

said pulse sequence having a predetermined sequence configuration that includes a radio-frequency excitation signal that excites nuclear spins in the examination subject, and a plurality of gradient fields, including a readout gradient field during which magnetic resonance data resulting from the excitation of the nuclear spins occurs, one or more of said gradient fields, when said magnetic resonance data acquisition unit is operated with said pulse sequence, causing a linear, location-dependent interference field to arise at a measurement location in the examination subject from which said magnetic resonance data are read out, and one or more of said gradient fields generating a spatially constant interference field at said measurement location, said linear, spatially-dependent interference field and said spatially constant interference field being oriented transversely to the respective gradient fields;

before acquiring said magnetic resonance data, implementing a solely computational, non-measurement based calculation in a processor to which said pulse sequence is supplied as an input for said calculation;

in said calculation in said processor, calculating at least a portion of each linear, spatially-dependent interference field and at least a portion of each spatially-constant interference field being oriented transversely to the respective gradient fields;

in said calculation in said processor, also calculating at least a portion of each linear, spatially-dependent interference field and at least a portion of each spatially-constant interference field at said measurement location, during a time interval between an excitation point in time at which said nuclear spins are excited, and a magnetic data acquisition point in time that occurs during said readout gradient, each of the calculated linear, spatially-dependent interference fields and the calculated spatially-constant interference fields exhibiting a time curve;

in said calculation in said processor, also automatically calculating, from the respective time curves, a first phase position displacement that occurs during said time interval due to said linear, spatially-dependent interference fields, and a second phase position displacement that occurs during said time interval due to said spatially constant interference fields;

for each gradient coil, determining, in said calculation in said processor, a single correction field pulse that produces a phase correction corresponding substantially to a negative of said first phase position displacement;

in said calculation in said processor, also determining at least one of a phase shift and a frequency shift for phase correction of said second phase position displacement;

acquiring magnetic data from the examination subject by operating said magnetic resonance data acquisition unit with a modification of said pulse sequence in which from each gradient coil, radiating the respective single correction field pulses pulse determined therefor at a predetermined point in time in said time interval that precedes said magnetic resonance data acquisition point in time to compensate artifacts in an image produced from said magnetic resonance data due to said linear, spatially-dependent interference fields; and also in said modification of said pulse sequence, applying at least one of said phase shift and said frequency shift to said excitation signal and to said magnetic resonance data acquired during said readout gradient to compensate for image artifacts in said image produced by said spatially-constant interference fields.

2. A method as claimed in claim 1 wherein the respective gradient coils radiate gradient pulses in said sequence, and superimposing said correction field pulses on the respective gradient pulses radiated by the respective gradient coils.

3. A method as claimed in claim 1 comprising employing a sequence for acquiring magnetic resonance data from each of a plurality of slices in a multi-slice magnetic resonance data acquisition, and correcting said interference fields in each of said slices.

4. A method as claimed in claim 3 comprising acquiring a magnetic resonance data set for each of said slices in succession, with each of said slices producing an interference field in successively-acquired slices, and successively correcting for said interference fields in said successive slices.

5. A method as claimed in claim 1 comprising determining said interference fields by displacing an origin of a coordinate system of said magnetic resonance apparatus to a middle position of each acquired slice.

6. A method as claimed in claim 5 comprising determining the respective interference fields by a Taylor expansion.

7. A method as claimed in claim 1 comprising using a point in time immediately before a beginning of said readout gradient field, as said magnetic resonance data acquisition point in time.

* * * * *